(12) United States Patent
Rauschenbach et al.

(10) Patent No.: US 9,668,392 B2
(45) Date of Patent: May 30, 2017

(54) METHOD FOR PRODUCING A HOUSING ENCLOSING AT LEAST ONE COMPONENT UNDER PRE-TENSION

(75) Inventors: Matthias Rauschenbach, Darmstadt (DE); David Flaschentraeger, Darmstadt (DE); Tobias Melz, Darmstadt (DE); Eberhard Abele, Buehl (DE); Jakob Fischer, Engenhahn (DE); Hanns Stoffregen, Frankfurt (DE)

(73) Assignees: FRAUNHOFER-GESELLSCHAFT ZUR FORDERUNG DER ANGEWANDTEN FORSCHUNG E.V., Munich (DE); TECHNISCHE UNIVERSITAET DARMSTADT, Darmstadt (DE)

( * ) Notice: Subject to any disclaimer, the term of this patent is extended or adjusted under 35 U.S.C. 154(b) by 531 days.

(21) Appl. No.: 14/127,986

(22) PCT Filed: Jun. 21, 2012

(86) PCT No.: PCT/EP2012/002624
§ 371 (c)(1),
(2), (4) Date: Feb. 21, 2014

(87) PCT Pub. No.: WO2012/175209
PCT Pub. Date: Dec. 27, 2012

(65) Prior Publication Data
US 2014/0165381 A1   Jun. 19, 2014

(30) Foreign Application Priority Data
Jun. 21, 2011   (DE) .................. 10 2011 105 044

(51) Int. Cl.
*H01S 4/00*   (2006.01)
*H05K 13/00*   (2006.01)
(Continued)

(52) U.S. Cl.
CPC ........... *H05K 13/00* (2013.01); *B22F 3/1055* (2013.01); *B29C 67/0077* (2013.01);
(Continued)

(58) Field of Classification Search
CPC ... B22F 3/1055; B29C 70/70; B29C 67/0077; H01L 41/0536; H01L 41/23;
(Continued)

(56) References Cited

U.S. PATENT DOCUMENTS 6,376,971 B1 *  4/2002  Pelrine .................. F04B 35/045
                                                     310/363
6,450,393 B1   9/2002  Doumanidis et al.
(Continued)

FOREIGN PATENT DOCUMENTS

DE            198 57 550 A1    6/2000
DE       20 2006 010 214 U1   11/2006
DE       10 2009 043 597 A1    4/2011

OTHER PUBLICATIONS

Calvert, Paul, et al: "Freedom Fabrication of Composites With Embedded Sensors," SPIE Conference on Sensory Phenomena and Measurement Instrumentation for Smart Structures and Materials, Jan. 1, 1999 (Jan. 1, 1999), pp. 128-133, XP55041605.
(Continued)

*Primary Examiner* — Donghai D Nguyen
(74) *Attorney, Agent, or Firm* — Fitch, Even, Tabin & Flannery LLP (57) ABSTRACT

A method for producing a housing structure at least partially enclosing at least one component, wherein the housing structure is produced with a construction process utilizing at least one of repeated layered deposition and solidification of material, which is interrupted at least once before completion of the housing structure, and during at least one interruption at least one component, which is not produced by the
(Continued)

construction process, is joined to or disposed in a partially finished housing structure, and the construction process is then continued after the interruption until the housing is completed, wherein at least one of an actuator and sensor comprising at least partially a transformer material selected as the at least one component to be joined to or disposed in the housing structure.

23 Claims, 3 Drawing Sheets

(51) Int. Cl.
    *B22F 3/105*     (2006.01)
    *B29C 70/70*     (2006.01)
    *B29C 67/00*     (2017.01)
    *H01L 41/053*     (2006.01)
    *H01L 41/23*     (2013.01)
    *H01L 41/257*     (2013.01)

(52) U.S. Cl.
    CPC .......... *B29C 70/70* (2013.01); *H01L 41/0536* (2013.01); *H01L 41/23* (2013.01); *H01L 41/257* (2013.01); *Y02P 10/295* (2015.11); *Y10T 29/49002* (2015.01)

(58) Field of Classification Search
    CPC . H01L 41/257; H05K 13/00; Y10T 29/49002; Y10T 29/42; Y10T 29/49007; Y10T 29/49128; Y02P 10/2959
    USPC .... 29/25.35, 592.1, 595, 831, 846; 310/307, 310/311, 330, 363, 368
    See application file for complete search history.

(56) References Cited

U.S. PATENT DOCUMENTS

| 7,321,185 B2 * | 1/2008 | Schultz ................. B64C 3/52 310/368 |
|---|---|---|
| 2009/0173443 A1 | 7/2009 | Kozlak et al. |
| 2012/0183701 A1 | 7/2012 | Pilz et al. |

OTHER PUBLICATIONS

Rai, Rahul, et al: "Extracting Product Performance by Embedding Sensors in SFF Prototypes," Proceeding of the Solid Freeform Fabrication Symposium, Aug. 3-5, Austin, TX., Jan. 1, 2004 (Jan. 1, 2004), pp. 366-376, XP55041225.

Sherrit, Stewart, et al: "Monolithic Rapid Prototype Flexured Ultrasonic Horns," Ultrasonics Symposium (IUS), 2010, IEEE, Oct. 11, 2010 (Oct. 11, 2010), pp. 886-889, XP031952579, DOI:10.1109/ULTSYM.2010.5935440, ISBN: 978-1-4577-0382-9.

Li, Xiaochun: "Embedded Sensors in Layered Manufacturing," Jan. 1, 2001 (Jan. 1, 2001, XP55040571 (15 pages of title and index and 137 pages of thesis).

\* cited by examiner

METHOD FOR PRODUCING A HOUSING ENCLOSING AT LEAST ONE COMPONENT UNDER PRE-TENSION

CROSS REFERENCE TO RELATED APPLICATION

Reference is made to German Patent Application Serial No. 10 2011 105 044.6, filed on Jun. 21, 2011, which application is incorporated herein by reference in its entirety.

BACKGROUND OF THE INVENTION

Field of the Invention

The invention relates to a method for producing a housing structure at least partially enclosing at least one component, wherein the housing structure is produced in the course of a construction process characterized by repeated layered deposition and/or solidification of material which is interrupted at least once before completion of the housing structure. During the interruption the at least one component, which is not produced by the construction process, is joined to or in the partially finished housing structure. The construction process is then resumed after the interruption until the housing, which at least partially comprises the at least one component is completed. A housing structure that is produced by the method is also described.

Description of the Prior Art

In many technical applications, it is important to protect technical components from environmental influences, or from the opposite point of view, to protect the environment from potential hazards presented by the component. To this end, it is useful to accommodate the respective component in a surrounding housing, the shape, size and constitution of which, with regard to the physical and chemical properties thereof, are determined by the nature of the component that is to be accommodated in the housing.

Such housings or generally such housing structures typically have multiple housing parts, for example housing bases and housing covers, which must be joined to each other with the aid of suitable connecting means, for example in the form of screws, rivets, adhesives or the like. As the shapes of the housings become more complex, in keeping with the shape of the components to be accommodated therein, not only does the cost factor of producing such structural components rise, but they also become less and less reliable in terms of the protective function of the housing, since complex housing structures and shapes are based on housing joints in the form of threaded connections or adhesives or the like, which are subject to greater loads, with the result that such connections can be weakened or loosened. Furthermore, the effort involved in producing individualized housings in complex shapes becomes significant, particularly with regard to the production time, as well as production costs.

Processing and shaping techniques must be used in accordance with the material that is selected for creating the respective housing structure, so that the individual housing structures can be produced and assembled as required. The individual housing parts are usually produced in dedicated manufacturing steps, separately from the production and stockpiling of the components the housings are to contain.

Moreover, for conventional production processes, in which housing structures are assembled from separate parts, it is also possible to make one-piece housing structures using casting processes in which the component to be enclosed in the housing structure is cast into the housing structure, or the structure is cast around it during the casting. Since such casting methods usually demand high process temperatures, only heat-resistant components can be used in encasing processes of this kind.

German Patent DE 10 2009 043 597 A1 discloses a method for producing a labelled object using an additive production process. In one embodiment of the method, cavities are created in the object that is to be labelled, and loose, unsolidified material is removed from these cavities during an interruption in production and then the cavities are filled with magnetic material. The production process is then resumed.

U.S. Published Application 2009/0173443 A1 describes a method for manufacturing a three-dimensional object using a generative production process, in which an identification means (ID tag) is partially or completely embedded. In this process, the ID tag may be embedded in the 3D object either horizontally in one or more layers, or vertically, or "almost vertically".

German Patent DE 198 57 550 A1 discloses a method for encapsulating metal microcomponents that are disposed with integrated evaluation circuits on a chip surface. In order to save space, a protective cap is arranged directly on top of the integrated circuits and not outside of them. The corresponding areas of the integrated circuits are provided with a protective layer on which is deposited the bonding medium, glass solder or epoxy adhesive for example, for joining the wafer and the protective cap. The protective cap and the wafer surround a hollow in which the microcomponents are arranged.

German Patent DE 20 2006 010 214 U1 describes a receptacle for storing and transporting piece and bulk goods, to which a label bearing an RF transponder is attached as part of an IN-MOULD process.

SUMMARY OF THE INVENTION

The invention is a method for producing a housing structure that at least partially encloses at least one component in such manner that housings may be created in any shape without having to take into account high production costs and long production times.

It is also possible to introduce at least one component preferably entirely into a housing structure with a very complex shape without having to run the risk that the housing structure might be weakened at points that are exposed to stresses, such as are present in conventional enclosures in the form of housing seams.

A particular objective of the method is to create an functional unit with actuating and/or sensing capability, including at least one actuator and/or sensor element, which is/are accommodated in the most complete protection possible against external influences.

The method according to the invention produces a housing structure at least partially enclosing at least one component, which in a construction process featuring the repeated, layered deposition and/or solidification of material, wherein the process is interrupted at least once before the housing structure is completed, and during which interruption the at least one component, which is not produced by the construction process, is joined to or in the partially finished housing structure. Then the construction process is continued following the one interruption until the housing which at least partially comprises the at least one component is completed. An actuator and/or sensor element including at least partially a transformer material is selected as the at least one component to be joined to or in the housing structure and during and/or after the construction process, partial regions of the forming or formed housing structure are locally heated or cooled to initiate a thermomechanical shrinking of the housing structure at least partially comprising at least one component, so that the housing structure exerts a mechanical pre-tension effect on the enclosed actuator and/or sensor element.

Layered construction processes of such kind are called generative production methods, and they may be used to manufacture three-dimensional objects as single parts in monolithic construction on the basis of a numeric dataset that describes the shape and size of the object. The generative construction process that is characterized by repeated, layered deposition of material and/or by layered solidification of material is interrupted at least once, at a stage in which a housing structure is partially finished. During the process interruption, the actuator and/or sensor element having at least partially a transformer material, which is stockpiled separately from the construction process, and is thus not produced together with the construction process of the housing structure, is joined on or in the at least partially completed housing part. The joining operation may be carried out manually or by automation, that is to say with robot assistance. As soon as the joining operation is completed, the construction process is continued until the housing structure, which at least partially encloses the at least one actuator and/or sensor element, is completed.

In the context of the invention, the term "housing structure" is understood to refer not merely to a structural unit whose only technical function is the enclosure of an actuator and/or sensor element, but in this context should also embrace technical structural components of all kinds that locally at least partially encase or encapsulate at least one actuator and/or sensor element.

Generative production processes lend themselves particularly advantageously to the formation of housing structures that completely enclose the at least one component in a single-part structure, so that the at least one actuator and/or sensor element is protected from environmental influences, for example, by the housing structure. The single-part construction means that joining and sealing elements, which are susceptible to the stress or wear symptoms caused by operation or use as described in the introduction, are not required. The creation of complex housing shapes using generative construction processes can also be carried out relatively quickly and inexpensively compared with conventional construction methods.

The interruption of the generative construction process for producing a housing structure can be used advantageously not only to join or introduce the actuator and/or sensor element onto/into the partially completed housing part, but also making technical adjustments to the housing part that cannot be carried out as part of the generative construction process. For example, the surface composition of the partially finished housing part may be altered using mechanical surface processing techniques, milling, drilling, grinding, polishing or cutting, for example, being a non-exhaustive list of the most frequently practised of such surface processing techniques. In this way, for example, the surface structure and/or texture of the partially finished housing predefined by the construction material may be modified. Thermal surface treatments, such as the application of heat by convection or radiation, may also be carried out during the process interruption.

If the surface composition of the partially finished housing shape is to undergo local or large-area etching processes, or correspondingly coated by galvanic material deposition methods, suitably selected chemical surface processing techniques may be implemented. Physical coating methods may also be applied to the shape of the partially finished housing structure by gas phase deposition or sputtering to name just a few methods. Local material removal can be carried out using electroabrasive processes according to the nature of the construction material.

After the completion of such processing steps for modifying the partially finished housing part, the generative construction process may be continued until the at least one component is at least partially, preferably completely enclosed by the housing.

The generative construction process may advantageously be interrupted more than once, so that further processing options may be carried out on the housing structure under construction. For example, a further interruption to the construction process may be effected at least before or after the at least one interruption of the construction process and before the housing structure is completed, during which at least one further component is attached to or in the partially finished housing part and/or a further treatment is carried out in and/or on the partially finished housing, which cannot be carried out during the construction process, as was explained previously with reference to the various surface processing techniques. In this way, the housing structure may be furnished with a plurality of components besides the at least one actuator and/or sensor element at various points within the housing structure as it is being formed, and it may be constructed with suitable technical functional elements or function surfaces. Suitable examples of such will be explained in the following with reference to the embodiments.

In order to be able to continue the construction process carefully after the interruption, it is necessary to conduct an inspection and if necessary a system adjustment of the apparatus required for carrying out the construction process in order to ensure that the subsequent layered material deposition and/or material solidification exactly matches the already partially finished housing structure. The inspection and possible system adjustment may be carried out manually or by means of suitable sensor systems.

In principle, the method according to the invention may be applied to the production of housing structures of any size and having any degree of complexity. It is true that there are technical limits to the practical realization, particularly in respect of the systems available for performing generative production processes, but technological advances in these areas are being made constantly.

The focus of the housing structures and the housing function associated therewith that are described in the following lies in the encapsulation or encasement of actuator and/or sensor systems that at least partially comprise transformer material or transformer materials of the species named hereafter: piezoelectric crystals, piezoelectric ceramics, piezoelectric primers, electrostrictive materials such as electrostrictive ceramics, electrorheological fluids, electroactive polymers, magnetorheological fluids, shape memory alloys or shape memory polymers.

Actuator and/or sensor systems, particularly those based on the transformer material or materials listed previously, benefit particularly from a housing that protects them from environmental influences, thereby making them available for use in the widest possible range of technical possibilities.

An encapsulation according to the invention of a piezoactuator that is electrically connected to a "shunt resistor" for the purpose of adaptive vibration damping, in which vibration energy that has been converted into electrical current is converted into heat with the aid of the piezoactuator, to thus extract vibration energy from a vibrating system in controlled manner, which system is vibration-damped thereby, will be described as representative of a wide variety of embodiments and application areas for such actuator/sensor systems. The method according to the invention provides the capability also to encapsulate an adaptive piezoelectric vibration damping unit of such kind hermetically in a monolithic housing in conformance with the shape and size of the damping unit.

Particularly, piezoelectric materials, but also other transformer materials that are used as actuators and/or sensors because of their transformer properties, advantageously need mechanical pre-tension, which must most often be applied to the respective piezoactuator or sensor from the outside. Pre-tension for this purpose may be achieved and generated using the method according to the invention if the piezoelement is inserted in the partially finished housing part during an interruption in the construction process according to the invention and the construction process is continued with a certain process profile in such manner that the housing structure formed subsequently undergoes thermomechanical shrinking during the construction thereof and/or during the following cooling, which in turn sets up a pre-tension exerted by the housing structure on the piezoelement encased in the interior thereof.

The process profile necessary for this must be selected according to the type of the generative production process. For example, if selective laser sintering of polyamides is used as the generative production process, the speed of layered material deposition in the working plane and the subsequent selective melting of the powered material layer may be varied, accelerated or slowed, for example. The process heat during the construction processes and therewith also the creation of thermomechanical tensions within the housing structure being constructed may thus be influenced by suitable selection of the process speed with regard to the repeated layer sequences.

Moreover, the generative production technique of laser sintering, generative production processes in which powder material is deposited in layers on a working plane and solidified by selective spreading of a usually liquid or pasty binding agent are also suitable. If metal powder is used as the layer material, energy beam deposition methods enable the metal powder spread in layers to be melted locally to construct a three-dimensional housing structure. As in the case of adding a binding agent, the thermomechanical shrinking of the housing structure at least partially enclosing the at least one piezoactuator or sensor can be initiated by at least one heat source, via which the housing structure is heated, regardless of whether or not thermal processes are used to solidify the respective layer material. With this heating, the housing structure can be heated homogeneously, or also non-homogeneously, as it is being formed, so that different areas of the housing structure are heated to varying degrees, and consequently mechanical tensions are created in a subsequent cooling process and generate a mechanical pre-tension that acts on the piezoactuator or sensor enclosed in the housing structure.

A preferred source for heating the housing structure is a heater that is integrated in the construction stage, and which provides heating on one side of the housing structure as it grows in layers on and over the construction stage. The construction stage is lowered with respect to a horizontal working plane, in which the powdered material layer is applied and locally solidified, thus creating construction space for the housing structure as it is formed. Electric heater elements known per se that are preferably able to provide uniform temperature control of the construction stage lend themselves well to the purpose of heating.

Alternatively or in combination with a construction stage heater, an additional heat source in the form of a heat radiating source is advantageously provided in the area of the construction space and directs radiant heat toward at least partial areas of the housing structure forming on the construction stage.

If the powder material is an electrically conductive material, for example in the form of a metal powder, an induction heater is suitable for heating the housing structure and thus to give rise to thermally induced tensions in the housing structure for the purpose of exerting a mechanical pre-tension required for the functioning of the piezoactuator and/or sensor, piezoelement for short, which is disposed inside the housing structure.

In all applicable variants for heating the housing structure, the nature and method of cooling the housing structure is equally important. Cooling may be effected with the aid of cooling media, which are supplied to the housing structure evenly or differently according to space, for example through cooling ducts provided for this purpose on or in the housing structure, or in the form of streams of cooling gas that are directed toward the heated housing structure via valve outlets arranged suitably on the construction stage. Cooling can be carried out as needed by immersing the housing structure in cooling fluid bath.

The temperature control techniques described in the preceding enable an adjustable process temperature and temperature distribution to be maintained without the housing structure during the construction process and equally after the construction process as well. Thus it is possible to use particularly temperature-sensitive construction materials, for example suitably selected metal alloys, which manifest a phase transition from face-centred cubic (FCC) austenite to body-centred cubic (BCC) martensite, and thus undergo a significant shrinkage effect of up to several percent, since the packing density may be significantly higher in the BCC atomic lattice. This volume reduction may be significantly greater than the usual thermal shrinkage. This effect may be exploited variously depending in the metal alloy used. In this case, two parameters are essentially of importance, the transition temperature (Tu) and the speed at which the body cools to below this temperature.

For example, a nickel-titanium alloy has a phase transition temperature Tu of about 100° C., that is to say when it cools to below the Tu, the crystalline structure of NiTi changes from austenite to martensite, and undergoes a certain volume shrinkage. For the construction process for a housing structure of NiTi, the construction process must be conducted at a process temperature above Tu. The housing structure and the piezoelement housed therein must not be allowed to cool to below Tu until the construction process is completed, for then the shrinkage is initiated that results in the mechanical pre-tension of the actuator/sensor within the housing structure.

Another option for setting or creating a pre-tension directed at the piezoelement encapsulated by a housing structure provides for the formation of an elastic housing wall as part of the generative construction process, wherein one side of the piezoelement is disposed so as to rest against the inner wall thereof. An elastically formed housing wall may be created for example using film hinges or by a wall structure having a bellows-like design.

A specific example thereof is described in the following with reference to the embodiments. An adjustment means for example, in the form of an adjusting screw for example, that is attachable so as to be movable along the length of the housing and engageable with a threaded structure created inside the housing, and able to be brought into contact with the expanding housing wall and thus indirectly with the piezoelement in the interior thereof is provided to generate an external force that places the piezoelement under pre-tension. Both the threaded structure and the adjustment means may be produced as part of the generative construction process.

Alternatively, it is possible to provide the threaded structure inside a component that is separate from the housing structure, and which is made from a different, preferably more resistant material than the construction material used for the housing structure. This separate component may also be integrated in the partially finished housing structure during an interruption in the construction process. In addition to the function of the threaded structure for creating pre-tension acting on the piezoelement, the threaded structure may also serve as a flange or connecting structure, for joining the housing structure designed according to the invention to a higher-level system.

In order to create the pre-tension acting on the piezoelement via the housing structure, external force may also be exerted on the housing structure during the construction process, resulting in mechanical deformation, for the purpose of causing expansion or stretching of the housing structure, and which generates an elastic returning force inherent in the material after the construction process is complete, which force serves to exert mechanical pre-tension acting on the piezoelement. For this purpose, a housing wall that is elastically deformable at least in areas thereof, for example that the elastically deformable housing wall is designed in the manner of a bellows and/or that the elastically deformable housing wall possesses an elasticity inherent in the material, must be created inside the housing structure.

After the construction process for the implementation of the at least one piezoelement in the semi-completed framework structure has been interrupted, the mechanical external pressure is, generated by a force acting on the housing structure, which operates on the housing structure via a compression force directed laterally against the bellows-like and/or elastically deformable housing wall and/or by means of a tensile force exerted in the direction of the fold or in the direction of elastic deformation.

In the opposite manner to the preceding deformation of the housing structure during the construction process, it is alternatively expedient to subject the piezoelement to a mechanical pressure after it has been implemented in the partially finished housing structure. This pressure causes the piezoelement to undergo a longitudinal contraction, wherein the piezoelement is at least partially enclosed by the housing structure in this shortened condition in the subsequent construction process, and is exposed to a mechanical pre-tension exerted by the housing structure. This presupposes a housing structure that is longitudinally stable, and which prevents the piezoelement from extending unhindered after the pressure exerted on the piezoelement is removed, so that the piezoelement within the housing structure is subject to a clamping force corresponding to the mechanical pre-tension.

Finally, a property of piezoelectric materials can be used advantageously to generate a mechanical pre-tension in the sense explained in the preceding.

Piezoactuators are polycrystalline components, are individual cells having Weiss domains which provide dipole moments. If an actuator has been poled, most of the Weiss domains are aligned uniformly by applying an electrical field which is accompanied by a slight longitudinal change along the applied electrical field. When the field is removed from the actuator, the individual cells remain partially in the aligned state, and this state is referred to as remanent poling.

The remanent poling can be largely or completely eliminated by heating the actuator above an actuator-specific temperature level. Consequently, the actuator then "shrinks" to its original length.

In order to exploit this property for the purposes of the invention, the piezoelectric transformer material, that is to say the piezoelement, is heated prior to its implementation in the partially finished housing structure, to ensure that the piezoelectric material retains no significant remanent poling. It is not until after the construction process is complete and the piezoelement is integrated in the housing structure that an electrical field is applied, resulting in poling of the piezoelectric transformer material and expansion thereof, thus causing the housing structure to exert mechanical pre-tension on the piezoelement accommodated therein. Since this involves overcoming the rigidity of the housing structure, finally a state is set up in which the length of the piezoelement is between its natural, minimum (unpoled) length and its remanent poled length. Traction is created between the housing and the actuator, and thus to pre-tension.

Further design options of a housing structure produced according to the invention will be explained in the following description with reference to the exemplary embodiments.

BRIEF DESCRIPTION OF THE DRAWINGS

In the following, the invention will be described using the embodiments and with reference to the drawing for exemplary purposes without limitation as to the general application of the inventive thought thereof. In the drawings:

FIGS. 5 a, b and c show a bellows-like housing structure with mechanical deflection;

FIGS. 6 a and b show a bellows-like housing structure with a fluid channel;

DETAILED DESCRIPTION OF THE INVENTION

Figure 1A:
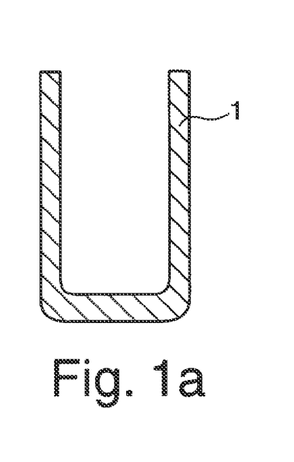
FIGS. 1a, b, c show a sequence of graphical representations to illustrate the invention.
Figure 1B:
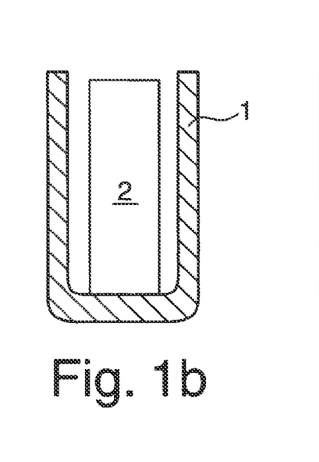
Figure 1C:
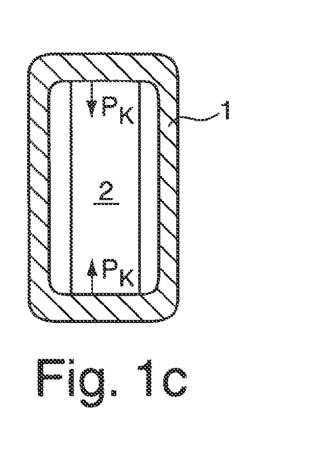

FIGS. 1a to c show image sequences for explaining the basis of the invention.

FIG. 1a shows a lengthwise cross section through a partially finished housing structure 1 that has been created in a generative production process. The shape and size of housing structure 1 is present in the form of a numerical dataset on which the generative production or manufacturing method for three-dimensional design of the housing structure is based. The following known generative manufacturing methods are recognized as suitable methods for this purpose: photolithographic rapid prototyping, photopolymerizaton by layered curing from a liquid bath, layered application and solidification of powder layers, layered dispersion of a bonding agent in a powder composite, energy beam deposition methods in metal powder or plastic extruder techniques, "fused deposition modelling".

In FIG. 1a, it is assumed that partially finished housing structure 1 is constructed in the shape of a pot, wherein the generative construction process has been interrupted at a stage in which pot-like housing structure 1 is freely accessible from above. Depending on the generative production method selected, the material that has not solidified during the generative construction process has to be removed from inside the pot structure, for example by selective suction, as will be explained in detail with reference to the sequence images in FIGS. 4a to h.

In the sequential image according to FIG. 1b, a component 2, for example a piezoelement, is introduced into the interior of partially finished housing structure 1 through the open top thereof, which piezoelement may be used as an actuator or sensor on the basis of its energy converting properties. The piezoactuator is preferably fixed on one side to the bottom of the housing by means of an adhesive bonding agent. After partially finished housing structure 1 has been fitted correspondingly with component 2, the generative construction process is continued, wherein the upwardly open, pot-like partially finished housing structure 1 is completely closed by the formation of a cover section, so that component 2 is hermetically enclosed by a monolithic, that is a single-part, housing structure (see FIG. 1c).

This operating method enables a housing structure to be formed as a single part having an inner volume that is hermetically completely surrounded and enclosed, without any separation or joining seams. Since it does not have any joining seams or surfaces, a housing structure created in this way is exceptionally strong and reliable for the purpose of providing a secure, durable seal and accommodation for a component 2 introduced into housing structure 1.

Alternatively to the introduction of at least one component on or into the housing structure, or in combination therewith, the method also provides the opportunity to carry out work on the housing structure that cannot be done during the generative construction process by making it possible to perform mechanical thermal, chemical and/or physical surface processing on the inner wall surfaces of the housing structure during the interruption to the generative construction process. For example, it is conceivable to apply a coating to the inner wall of the housing structure with a layer of material by a physical coating process instead of or before component 2 is inserted into the upwardly open, pot-like housing structure according to FIG. 1a. In the same way, the housing inner wall might be polished or ground in a mechanical surface machining process, or restructured appropriately using milling, drilling and/or cutting techniques. Surface treatment by way of thermal and/or chemical surface processing is also possible. Upon completion of such treatment of the partially finished housing structure, the generative construction process may be continued as appropriate until the housing structure is completed.

Particularly important in the present case is the hermetic encapsulation of actuators and sensors made from transformer materials. Accordingly, as has been mentioned previously with reference to the embodiment of FIG. 1c, the completely encapsulated component 2 represents a piezoelement, the preferred property of which is that it converts mechanical deformations into electrical energy and vice versa. According to the invention, the generative construction process for encapsulating piezoelement 2 as shown in FIG. 1c is carried out in such manner that the finished housing structure 1 exerts a pressing force $P_K$ on both sides of piezoelement 2 (see arrows in FIG. 1c). Such a pressing force may be created by controlling the construction speed with which the layered material deposition and/or material solidification takes place so as to influence the temperature of the housing structure during the construction process and the subsequent cooling phase, thus causing thermomechanical shrinkage to occur.

If the enclosed piezoelement shown in FIG. 1c is advantageously connected for example to a shunt resistor that is also accommodated in the housing structure together with piezoelement 2, a fully autarchic vibration damping component may be created.

In order to avoid, for example, the need to embed battery based charge sources in the completely enclosed housing structures to operate such vibration dampers, thereby limiting the operating life of such components, it is advantageous to manufacture the housing structure that surrounds the vibration damping component from a plastic material, which is processable by selective laser sintering of polyamides. The dielectric property of the housing material makes it possible to couple in energy inductively, with no wire passthroughs in the housing structure. Corresponding variants also enable corresponding sensor systems to be constructed.

Passive electronic circuits can also be integrated in housing structures made mostly from plastic, for example near field communications components (RFID), which can be used to prevent counterfeiting, identify components or carry out logistical tasks to name just a few application possibilities.

Figure 2:
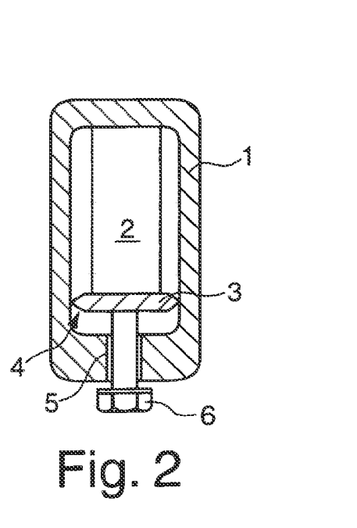
FIG. 2 shows an embodiment of a piezoactuator according to the invention encapsulated and under mechanical pre-tension.

FIG. 2 shows an alternative embodiment of a piezoactuator or piezosensor, which surrounds a piezoelement 2 inside a fully enclosed housing structure 1. The upper extremity of the piezoelement is braced against the inside of the upper wall of the housing structure 1 and the lower extremity is braced against a deformable housing wall 3, which is connected integrally with the rest of the housing inner wall via a film hinge unit 4. A thread 5 is also created in the housing structure, into which an adjustment means 6 in the form of a screw is insertable. An adjusting force acting on piezoelement 2 via housing wall 3 may be varied according to the insertion depth of adjustment means 6 via thread 5, in order to create mechanical pre-tension.

Figure 3:
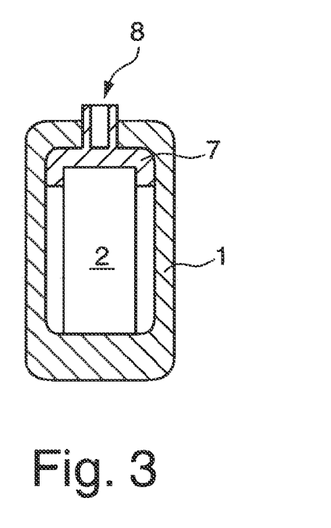
FIG. 3 shows a further embodiment of an encapsulated piezoactuator with a reinforcing structure.

FIG. 3 shows a further exemplary embodiment, in which a mechanically pre-tensioned piezoelement 2 is accommodated in a housing structure 1, whereof the upper extremity abuts and is enclosed by an additionally provided component 7, which functions as an intermediate element between piezoelement 2 and housing structure 1 to ensure sufficient thermal insulation from piezoelement 2 during the construction process and/or to provide suitable mechanical attachment for subsequent use. Accordingly, additional component 7 protrudes above the housing wall of housing structure 1 to create a fastening structure such as a threaded connection for example. In this way, the entire housing structure 1 may be coupled to a further mechanical system via fastening structure 8.

Depending on the material from which additional component 7 is made, the component may be joined to housing structure 1 either by adhesive bonding or a form lock.

If additional component 7 is made from the same material as the housing structure, the connection between the additional element and the housing is made in the form of an adhesive bond. Otherwise, a form lock is created.

Figure 4A:
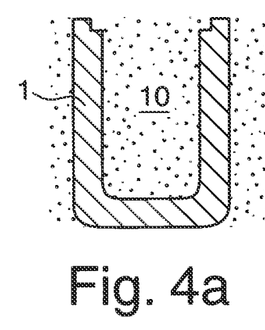
FIGS. 4a to h show a sequence of graphical representations to explain the generative construction process according to the invention with an interruption and process continuation.
Figure 4B:
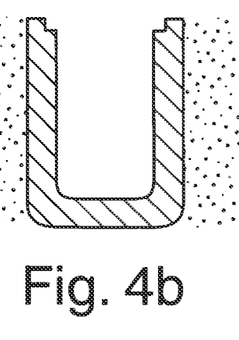
Figure 4C:
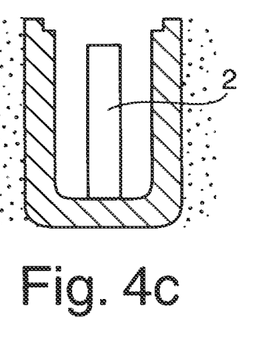
Figure 4D:
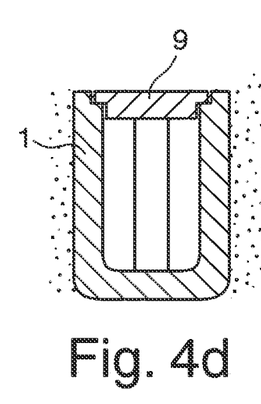
Figure 4E:
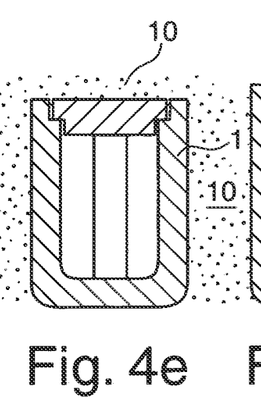
Figure 4F:
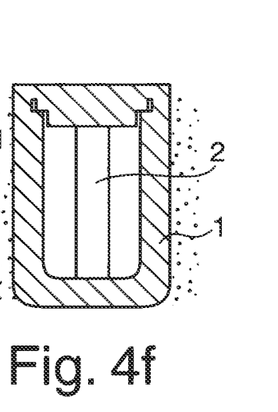
Figure 4G:
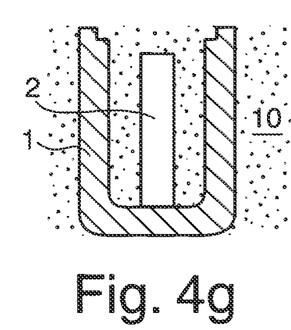
Figure 4H:
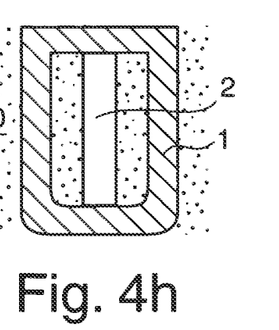

The sequence images of FIGS. 4a to h show the process steps for carrying out the method according to the solution in detail. Accordingly, in FIG. 4a it is assumed that the housing structure 1 that is partially finished in a generative construction process is entirely enclosed in a bed of powder 10, as is the case for example in the generative production of a body by selective laser sintering using metal or polyamide powder. It is further assumed that the partially finished housing structure 1 has the cross-sectional shape, which is effectively the shape of a pot, shown in FIG. 4a. At this point, in order to enable access for a component to be introduced into the interior of pot-shaped structure 1, the loose powder material 10 that was not solidified by the laser sintering process must be removed from pot structure 10. The interior of the pot-shaped, partially finished housing structure 1 may be cleared of such material using suitable suction techniques, as is the case in FIG. 4b. In FIG. 4c, a component 2 is introduced into the interior of partially finished housing structure 1 and the bottom extremity thereof is preferably attached to the base of the pot-shaped housing structure by adhesive bonding. In FIG. 4d, the one side of pot-shaped, partially finished housing structure 1 that is open is now closed off with a cover panel 9, which is made from the same material as housing structure 1. Cove panel 9 is furnished with a cover rim that mates precisely with the stepped inner rim of housing structure 1.

In order to continue the generative construction process of the laser sintering operation using powder material, cover panel 9 is provided with a layer of powder 10 (see FIG. 4e), which is then solidified suitably by laser beam deposition. In this way, the solidified material grows on top of cover panel 9 (see also FIG. 4f). Thus, the component 2 in the interior may be enclosed completely hermetically inside housing structure 1, and component 2 in the interior is located in an otherwise empty cavity inside housing structure 1.

An alternative process progression is represented in the image sequence 4g and 4h. Starting from the construction process step represented in the image of FIG. 4c, in contrast to the process step of FIG. 4g, a cover panel 9 is not placed on partially finished housing structure 1. Instead the cavity of pot-shaped housing structure 1 from which the powder 10 has been removed is completely filed with powder material 10 from the construction process, so that the component 2 inserted in housing structure 1 is entirely surrounded by loose powder material 10. The generative construction process is then resumed in conventional manner, wherein the powder layer areas are solidified by exposure to a laser beam. In this way, a housing wall is formed and grows over component 2, but unlike sequence image FIG. 4f, the wall surrounds an interior housing volume that contains loose powder material 10 as well as the inserted component 2.

In order to create mechanical stresses in the housing structure during the construction process, which will act on component 2 enclosed in the housing structure in the form of mechanical pre-tension after the housing structure is completed, special measures are necessary, which must be taken into account while the construction process is carried out.

A first option for introducing mechanical stresses into the housing structure relates to the application of thermal energy to the housing structure during the formation thereof. The energy is generated by a laser beam or similar energy source, and may be part of the construction process itself depending on the construction process which may be for example in the case of generative laser sintering or by means of a heating source to be provided separately on or in the installation space. Mechanical stresses may be created in the interior of the housing structure by controlled application of a predefined quantity of thermal energy to the housing structure.

A second option is the conservation of a force acting on the housing structure during the construction process, and which continues to act at least in part as a clamping force on the component enclosed in housing structure after the housing structure is completed.

Figure 5A:
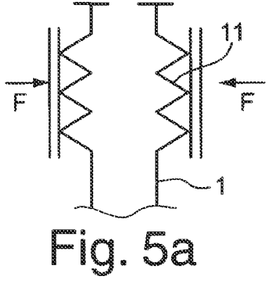
Figure 5B:
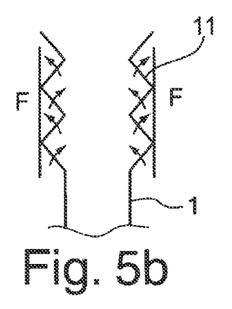

In this context, FIG. 5a shows an embodiment in which housing structure 1 is furnished with a subarea 11 constructed in the form of a bellows. The folding structure of enables it to stretch in a spatial direction F with the application of a force. In the case shown in FIG. 5b, a lateral force F acts on housing structure 1 and distends the shape of the housing.

Figure 5C:
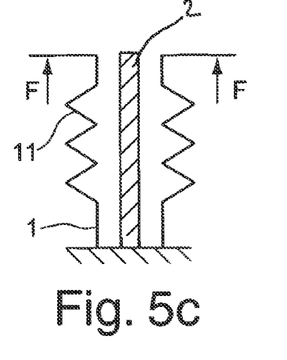

Alternatively, it is also possible to apply force F to housing structure 1 in a spatial direction in which bellows-like structure 11 is able to extend as shown in FIG. 5c.

Component 2, in the form of a piezoelement, is introduced into housing structure 1 while it is deflected by the application of a force, and is permanently encased in the housing structure by the formation of a top covering element during the subsequent continuation of the generative construction process. When the construction process is completed and the force associated therewith is removed, piezoelement 2 remains subject to a mechanical pre-tension, which originates from the bellows-like wall structure and the elastic returning force inherent in the material that is created therein.

Figure 6A:
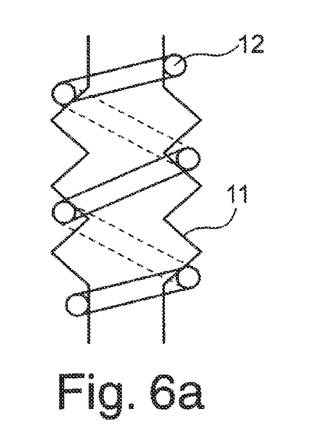

As an alternative to the mechanically supported deflection of bellows-like subarea 11 of housing structure 1, the deflection may be created by the application of thermal energy. For this purpose, a pipe 12 is formed in conjunction with the bellows-like design of the housing structure as part of the generative production process as shown in FIG. 6a in which the pipe is wound around bellows-like subarea 11 and is connected integrally therewith. Pipe 12 serves as a fluid channel, through which a liquid or gas-phase cooling or heating medium may be passed. In the case of a hot medium, bellows-like subarea 11 expands and with a cooling medium the area contracts.

Figure 6B:
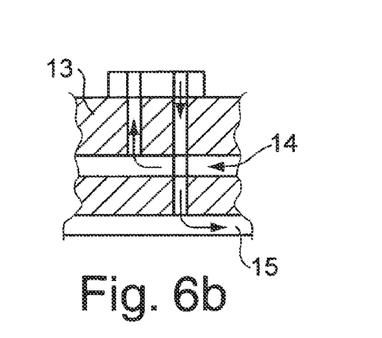

The cooling or heating medium is transported to and from the system via pipe 12, through a specially modified construction stage 13, as shown in FIG. 6b, on which housing structure 1 is formed by layer material deposition and solidification. Construction stage 13 comprises an integrated hollow line system that has an inflow 14 and a drain 15. The application of thermal influence of such kind causes bellows-like subarea 11 to change to an expanded, that is to say stretched, condition by corresponding heating, and in this state piezoelement 2 can be implemented in housing structure. As in the previous case with mechanically supported deflection, but unrestricted by an arrangement creating the mechanical pressure, the generative construction process is continued to enclose piezoelement 2 and obtain the mechanical pre-tension caused by the bellows-like wall structure and the elastic returning force inherent in the material and acting in the wall structure as soon as pipe 12 is disconnected from the heating medium, allowing housing structure 1 to cool down and contract. The cooling process may be accelerated or assisted by passing a cooling medium through pipe 12.

Figure 7:
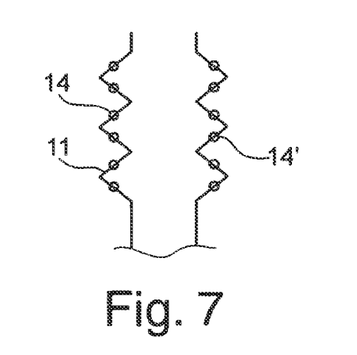
FIG. 7 shows a bellows-like housing structure with magnetic particles'.

FIG. 7 shows an embodiment variation of a bellows-like subarea 11 of housing structure 1 in which magnetic particles 14 are inserted, and which are able to deflect bellows-like subarea 11 correspondingly with the reciprocal action of a magnetic field. On the other hand, electrically conductive particles 14' may be inserted in the material from which at least bellows-like subarea 11 is made. The area may be heated by induction, thereby also causing a spatial expansion of the housing structure, which may be exploited in the manner described above.

Figure 8:
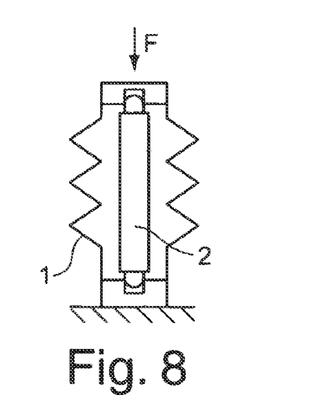
FIG. 8 shows the assembly of an actuator/sensor element to which a pressing force is applied.

Finally, with reference to the embodiment illustrated in FIG. 8, it is necessary to cite the option of loading and compressing piezoelement 2 with a pressing force and inserting it in partially finished housing structure 1 in this state. The mechanical compression is maintained until piezoelement 2 is encased on both sides by housing structure 1, so that the lengthwise expansion prompted by the removal of the constraint on piezoelement 2 is prevented by the housing structure, again giving rise to mechanical pretension.

LIST OF REFERENCE SIGNS

1 Housing structure
2 Component, piezoelement
3 Deflectable housing wall
4 Film hinge
5 Thread
6 Adjusting element, screw
7 Separate component
8 Fastening structure
9 Cover element
10 Powder
11 Bellows-like subarea
12 Pipe
13 Construction stage
14 Magnetic particles

The invention claimed is:

1. A method for producing a housing at least partially enclosing at least one component comprising at least one of an actuator or a sensor joined to or disposed in the housing and comprising a transformer material comprising:
repeating a sequence of steps with each step including deposition of a layer of material followed by solidification of the layer of material;
interrupting the sequence of steps at least once prior to completion of the housing;
during the interruption, joining to or disposing in the housing at least one of an actuator and a sensor;
resuming the sequence of steps after the interruption to complete production of the housing; and
during the interruption of the sequence of steps or after the resuming of the sequence steps after the joining to or disposing of the at least one actuator or sensor in the housing heating or cooling at least part of the housing to initiate a thermomechanical shrinking of the housing to exert pre-tensioning on the at least one actuator or sensor within the housing after the production is complete.

2. The method according to claim 1, wherein:
the production process is carried out as part of a generative production method in which powder material is deposited in layers on a working plane and solidified by selective laser sintering, in which a speed with which each material layer of powder material is applied to the working plane is varied to initiate the thermomechanical shrinkage of the housing structure enclosing the at least one component and the powder material layer is subsequently melted.

3. The method according to claim 2, wherein:
the production process is carried out as part of a generative production method in which powder material is deposited in layers on a working plane and is solidified by selective laser sintering, selective spreading of a binding agent, or by an energy beam deposition method, in which at least one heat source for heating the housing heats the housing to initiate the thermomechanical shrinkage of the housing enclosing the at least one component.

4. The method according to claim 3, wherein:
the at least one heat source is provided during the production process of the housing which is formed in layers; and
the at least one heat radiating source directs radiated heat toward at least partial areas of the housing and, the housing comprises an electrically conductive material and an induction heater is used as the at least one heat radiating source.

5. The method according to claim 2, wherein:
the powder material is a nickel titanium alloy.

6. The method according to claim 1, wherein
a metal or a metal alloy is utilized in the transformer material which undergoes a phase transition from a face-centered cubic austenite to a body-centered cubic martensite when the temperature thereof falls below a phase transition temperature with the metal or metal alloy being above the phase transition temperature during the production process and the housing is cooled to below the phase transition temperature after the production process is completed.

7. The method according to claim 1, wherein:
at least one area of the housing include an elastically deformable housing wall along which in at least sections thereof include a hollow line connected to the housing wall to provide an inflow and a drain via which a medium flows through the hollow line.

8. The method according to claim 7, wherein:
the inflow and the drain are provided during the production process and the elastically deformable housing wall undergoes during subsequent processing at least one of stretching and compression after the production processing of the sequence of steps is completed.

9. The method according to claim 7, comprising:
constructing the elastically deformable housing wall to provide a bellows and the elastically deformable housing wall comprises an elastic material.

10. The method according to claim 9, wherein:
mechanical pressure is generated by an external force acting on the housing to provide a compression force directed laterally against at least the bellows and provides a tensile force exerted in a direction of a fold of the bellows.

11. The method according to claim 1 comprising:
performing work during the interruption which cannot be performed during the the sequence of steps.

12. The method according to claim 1, wherein:
the producing is interrupted another time after a first interruption of the producing and before the housing is completed, during which at least one additional component is inserted on or disposed in the partially finished housing and the producing is again resumed at another time after interruption.

13. The method according to claim 1, wherein:
the at least one component is attached to the housing by at least one of adhesive bonding, form fitting and an adhesive joint.

14. The method according to claim 1, wherein the producing includes surface processing of an outside surface of the housing comprising at least one of the following operations:
   a mechanical surface treatment comprising at least one of milling, drilling, grinding, polishing and cutting;
   a thermal surface treatment comprising at least one of convective heating and radiant heating;
   chemical surface treatment comprising at least one of etching, galvanic deposition; and
   physical surface treatment comprising at least one of coating using vapor deposition or sputtering; electroabrasive material removal.

15. The method according to claim 14, wherein:
   the housing comprises at least one deflectable housing wall and the at least one component is attached to an inner housing wall and the housing includes a counter-bearing against a tensioning force applied to the deflectable housing wall.

16. The method according to claim 1, wherein the producing is part of the generative production method, and a shape and size of the housing is provided as a CAD dataset, which is incorporated in the generative production method as manufacturing parameters comprising at least one:
   rapid photolithographic prototyping;
   photopolymerization by layered curing from an liquid bath;
   layered application and solidification of powder layers;
   layered spreading of a bonding agent in a powder composite;
   energy beam deposition of a metal powder; and
   plastic extrusion.

17. The method according to claim 1, comprising:
   enclosing the housing to hermetically seal the at least one component as a single part.

18. The method according to claim 1, wherein:
   the transformer material comprises a piezoelectric polycrystalline material.

19. The method according to claim 18, comprising:
   hermetically enclosing the at least one component in the housing.

20. The method according to claim 1, comprising:
   monolithically enclosing the at least one of an actuator and a sensor in the housing, and the at least one component is jointed to the housing by one of adhesive bonding, form fitting or an adhesive agent.

21. The method according to claim 20, comprising:
   providing at least one additional component comprising a material harder than the material of the housing, the at least one additional component protruding into an interior of the housing structure, in contact with the at least one component, and protruding out of the housing structure and including a fastener.

22. The method according to claim 20, wherein:
   the housing includes a housing wall with at least areas thereof is elastically deformable, biaxially deflectable along a spatial axis and the at least one an actuator and a sensor operate in an actuating or sensory operating direction which is aligned parallel to the spatial axis along which the at least one actuator and the sensor is subjected to mechanical pre-tensioning of the housing.

23. The method according to claim 1, wherein:
   the at least one component comprises at least one of piezoelectric crystals, piezoelectric ceramics, piezoelectric primers, electrostrictive materials comprising electrostrictive ceramics, electrorheological fluids, electroactive polymers, magnetorheological fluids, shape memory alloys and shape memory polymers.

* * * * *